United States Patent [19]

Makino

[11] Patent Number: 4,768,026

[45] Date of Patent: Aug. 30, 1988

[54] YARN BREAK DETECTOR FOR SPINNING AND WEAVING MACHINES

[76] Inventor: Syozaburo Makino, 441 Imaiminamicho, Nakahara-ku, Kawasaki-shi, Kanagawa-ken, Japan

[21] Appl. No.: 63,645

[22] Filed: Jun. 17, 1987

[51] Int. Cl.$^4$ .................... G01R 29/12; G08B 21/00
[52] U.S. Cl. ..................................... 340/677; 73/160
[58] Field of Search ............... 340/677, 675; 57/81; 73/160

[56] References Cited

U.S. PATENT DOCUMENTS

| | | | |
|---|---|---|---|
| 2,774,061 | 12/1956 | Breuning | 340/677 |
| 3,731,069 | 5/1973 | Goto et al. | 340/677 X |
| 3,863,241 | 1/1975 | Kamiyamaguchi | 340/677 X |
| 4,311,958 | 1/1982 | Aeppli | 340/677 X |
| 4,420,697 | 12/1983 | Fiedler et al. | 57/81 X |

Primary Examiner—Stewart J. Levy
Assistant Examiner—Joseph W. Roskos
Attorney, Agent, or Firm—Koda and Androlia

[57] ABSTRACT

The present invention provides a yarn break detector for spinning and weaving machines comprising at least one pair of detection electrodes, AC amplifiers of high input impedance, a balancer, a differential amplifier, a rectifier and a relay circuit. At least one pair of detection electrodes induce an electric charge on the yarn, and the induced electric potential is amplified, rectified and smoothed. In the event of yarn break or stoppage of yarn run, the relay circuit is activated on sensing the level difference between the high-potential DC voltage generated during normal run of yarn and the low-potential DC voltage generated at the time of yarn break or stoppage of yarn run, and an output signal is issued as yarn break signal, informing of the yarn break or stoppage of yarn run.

1 Claim, 4 Drawing Sheets

YARN BREAK DETECTOR FOR SPINNING AND WEAVING MACHINES

BACKGROUND OF THE INVENTION

The present invention relates to a yarn break detector for spinning and weaving machines, More particularly, it relates to a device for detecting yarn break or stoppage of yarn run by monitoring the state of running of yarn in a spinning or weaving machine.

In the production of yarns or textile goods by use of a spinning or weaving machine or other textile machines, if there takes place an unexpected break on the spun out of fed yarn in the production process, the obtained products will become defective. In order to cope with such trouble, it is required to incorporate a suitable countermeasure such as providing a means for issuing an alarm or stopping the machine upon occurrence of yarn break.

Various types of yarn break detecting means have been proposed and used, which include the following: microswitch system in which a microswitch is connected to an actuator so that said microswitch will be opened or closed according to the presence or absence of yarn tension to thereby detect the yarn break; photoelectric system in which light is projected to the yarn to detect the yarn break, should it occur, by the variation of its projection; electrostatic capacity system in which the yarn is let run between two pieces of electrode and the variation of electrostatic capacity between the two electrodes is monitored to detect any yarn break; electric charge detection system in which the variation of electric charges on the yarn is monitored to detect the yarn break.

Any of these known systems, however, has its own merits and demerits. For instance, the microswitch system is advantageous in terms of cost, but this system has the problems that a detecting element must be always mechanically kept in contact with the yarn, and that the operation of the system is not always reliable.

The photoelectric and electrostatic capacity, systems are capable of performing detection in a non-contacted state with the yarn and also relatively reliable in their operations, but they are both costly in adaptation. Also, the photoelectric system has the necessity of regulating the yarn path, while the electrostatic capacity system has the problem of complicated circuit structure because of the use of high frequencies.

The electric charge detection system is susceptible to the influence of the electric field induced from the outside and therefore bad in the signal/noise ratio (S/N ratio). Also, since this system necessitate a shield plate for shutting off the induced noise, the scope of use thereof is limited.

In view of these problems of the prior art systems, the present inventors have made more extensive studies and succeeded in achieving the present invention.

SUMMARY OF THE INVENTION

An object of the present invention, therefore, is to provide a yarn break detector adaptable to the spinning and weaving machines, which detector is simple in structure, low in cost and small in size, allows a wide choice for the shape of detection electrodes, and requires no electrostatic shielding for the detection electrode surfaces.

Another object of the invention is to provide a yarn break detector for spinning and weaving machines, which detector is not only capable of performing detection in a non-contacted state with the yarn but also phenomenally improved in signal to noise ratio (S/N ratio) (since the ripple of power source is countervailed), unaffected by the external factors, wide in the regulated range of running yarn path and capable of detecting not only yarn break but also stoppage of normal run of yarn.

The yarn break detector of this invention is characterized by its structure comprising essentially a pair of detection electrodes formed as a printed circuit of substantially equal areas on a base plate, said pair of detection electrodes being disposed in correspondence to the running yarn and adapted to induce an electric charge on the yarn, a pair of AC amplifiers of high input impedance for amplifying the electric potentials induced by said pair of detection electrodes to which said AC amplifiers are electrically connected via lead wires electrostatically shielded by a shield block, a balancer for balancing the output signals from said pair of AC amplifiers in an in-phase and synchronized fashion, a differential amplifier for differentially amplifying the output signals from said balancer, a rectifier for converting the output signals from said differential amplifier into a DC signal, a comparator which compares the output voltage of said rectified and regulated comparison voltage and issues an output when the output voltage of said rectifier is lower in potential than the comparison voltage, and a relay circuit which is actuated by the output signal from said rectifier.

Said and other objects and advantages of the present invention will become more apparent as the invention is more fully described below with reference to the accompanying drawings.

DETAILED DESCRIPTION OF THE INVENTION

Figure 1:
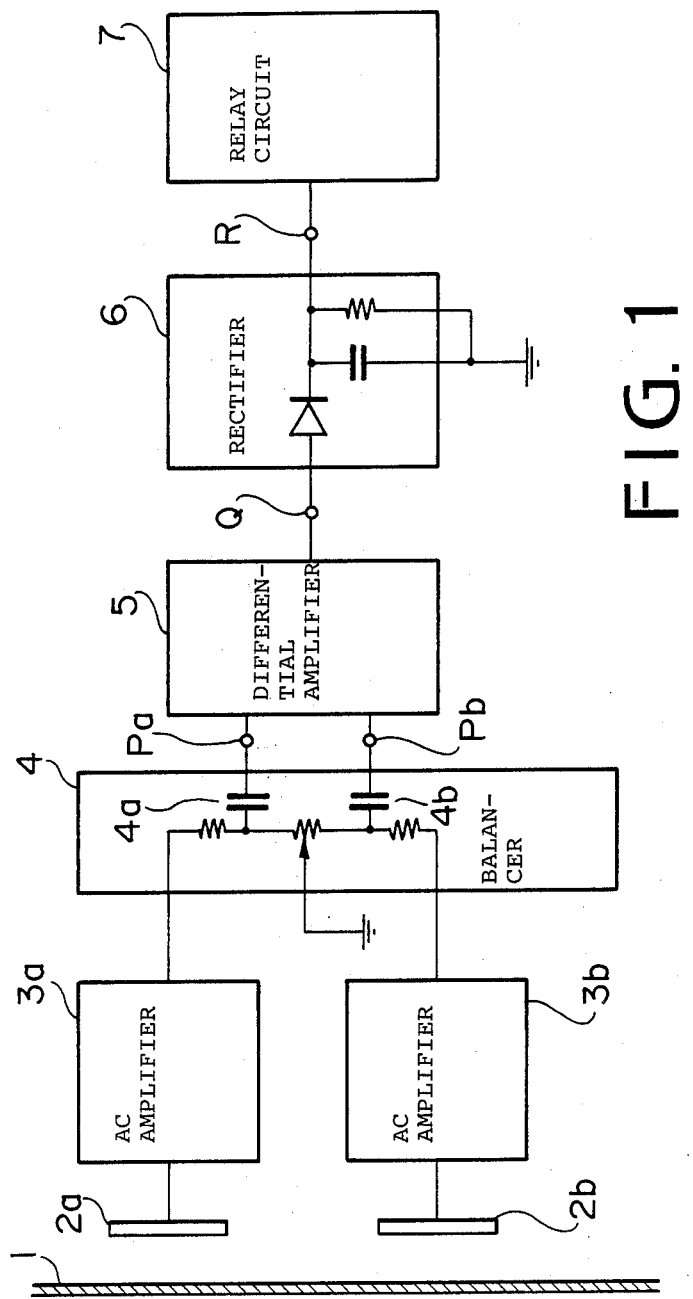
FIG. 1 is an electric block diagram for illustrating the operational principles of the yarn break detector according to the present invention.
Figure 2:
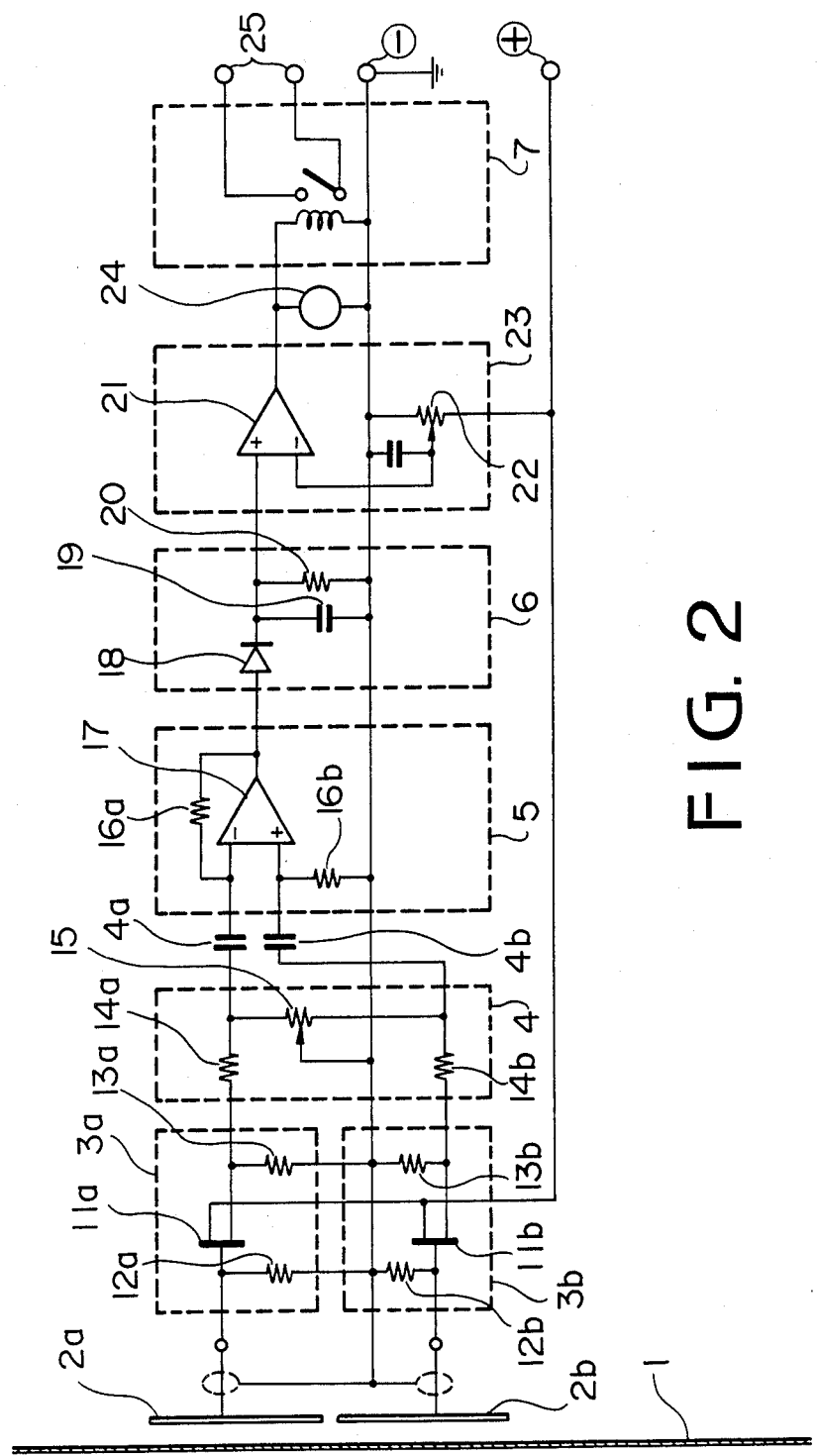
FIG. 2 is an electric circuit diagram of the yarn break detector according to the present invention.

Referring first to FIGS. 1 and 2 of the drawings, there is shown a preferred embodiment of the yarn break detector according to this invention. As shown in the drawings, at least one pair of detection electrodes 2a, 2b are disposed in correspondence and close adjacency to the yarn 1.

In this embodiment, yarn 1 is let run along a path just midway between the pair of electrodes 2a, 2b, but this is not the only way of yarn running effectible in this invention; the similar effect can be obtained by letting the yarn run in an aslant direction.

Figure 3:
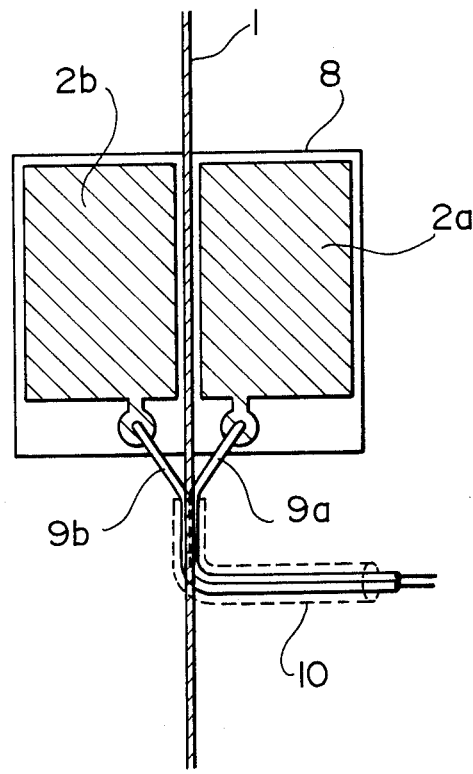
FIG. 3 is an enlarged view of the detection electrode portion.

As shown in FIG. 3, said detection electrodes 2a, 2b are formed as a printed circuited on a base plate 8, and they are substantially equal in surface area. Said electrodes 2a, 2b are connected to lead wires 9a, 9b, respectively, which lead wires 9a, 9b are electrostatically shielded by a shield 10 en bloc and connected to the respective input terminals of the AC amplifiers 3a, 3b of high input impedance as shown in FIGS. 1 and 2.

Referring to FIG. 2, the fluctuating potential of an electric charge of yarn 1 is induced by the detection electrodes 2a, 2b which are connected to the gate terminals of the field effect transistors 11a, 11b, respectively. Said gate terminals are earthed by leakage resistors 12a, 12b, while the source terminals are earthed by bias resistors 13a, 13b. These constitute the AC amplifiers 3a, 3b of high input impedance.

AC amplifiers 3a, 3b function to amplify the small alternating potentials induced by the detection electrodes 2a, 2b and apply them to the output terminals of a balancer 4.

Said balancer 4 consists of fixed resistors 14a, 14b and a variable resistor 15, and it functions to balance the output signals from the AC amplifiers 3a, 3b by eliminating the imbalance of said output signals by varying the resistance of variable resistor 15 to output the balanced signals. The output terminals thereof are connected via capacitors 4a, 4b to the input terminals of a differential amplifier 5 which consists of resistors 16a, 16b and an operational amplifier 17.

The AC output signal which has undergone differential amplification by said differential amplifier 5 is then converted into a DC output signal by a rectifier 6 composed of a diode 18, a capacitor 19 and a resistor 20, and is led to the input terminal of comparator 21 of a comparison circuit 23 which consists of said comparator 21 and a variable resistor 22.

To the comparison terminal of said comparator 21 is applied a voltage adjusted by said variable resistor 22 to adjust the sensitivity. The output of said comparator 21 is connected to an indicator 24 and a relay circuit 7 so that said indicator 24 and relay circuit 7 are actuated by the output signal from said comparator 7. Also, the output terminal 25 of said relay circuit 7 is connected to a yarn run stopping device or a yarn cutting device (not shown) in the machine to operate these devices.

In operation of the yarn break detector having the described structure according to this invention, when yarn 1 is not running, the external noise potentials induced by the respective detection electrodes 2a, 2b are in-phase and synchronized with each other, so that when they are further adjusted to the potentials of the same level by variable resistor 15 of balancer 4, both of them are cancelled by differential amplifier 5 and the output signal from said differential amplifier 5 becomes zero or only a slight output is issued. Therefore, since the output voltage R of rectifier 6 is also low, when the comparison voltage of comparison circuit 23 is adjusted to be slightly higher than the output voltage R of rectifier 6, the output of comparator 21 becomes "1" potential, bringing the indicator 24 and relay circuit 7 into an operative state.

When yarn 1 is running, the detection signals corresponding to the electric charges on the yarn are induced by detection electrodes 2a, 2b. Since these detection signals are induced in a non-equiphaseal and non-synchronized fashion, the combined signal thereof is output from differential amplifier 5 and the output voltage R of rectifier 6 becomes high in potential. Consequently, the output signal from comparator 21 becomes "0" potential and both indicator 24 and relay circuit 7 are disactivated.

In case yarn 1 stops running due to the occurrence of a certain phenomenon such as yarn break, the non-equiphaseal and non-synchronized yarn run signals induced by detection electrodes 2a, 2b necessarily die out and the initial state where the yarn stays still is restored, bringing indicator 24 and relay circuit 7 into an operative state to inform of the yarn break or issue a corresponding signal.

The above-described embodiment of the invention will be further depicted below from its operational aspect.

Figure 4:
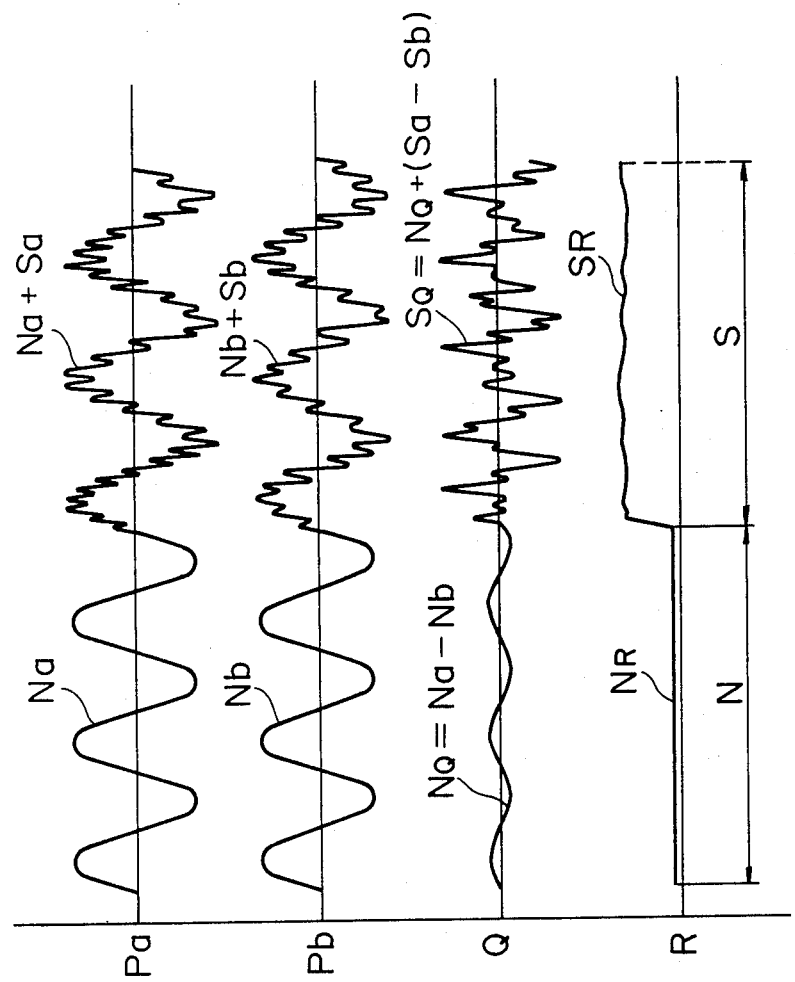
FIG. 4 is a drawing showing the wave forms of the electric signals from the respective elements.

Referring to FIGS. 1 and 4, yarn 1 is charged positively or negatively by virtue of friction with an object containing air, and the charges thereof are induced by the pair of detection electrodes 2a, 2b. When yarn 1 stays still, non-fluctuating static electricity is induced by detection electrodes 2a, 2b, but when yarn 1 runs, the fluctuating potentials are induced by both detection electrodes 2a, 2b due to variations of the yarn outer diameter, running position, etc., and the non-uniformity of electric charges on the yarn itself.

The induced potentials are very small in terms of quantity of electricity, so that they are amplified by AC amplifiers 3a, 3b of high input impedance. On the other hand, since detection electrodes 2a, 2b are of high impedance against earth, the induced potentials from commercial power are also induced by detection electrodes 2a, 2b along with said fluctuating potentials of yarn 1. These induced potentials can be reduced to a certain degree if detection electrodes 2a, 2b are electrostatically shielded with earth potential, but there still remains a portion that is induced through yarn 1. The induced potentials from commercial power are in-phase with each other for detection electrodes 2a, 2b, so that if both detection electrodes 2a, 2b are substantially equalized in area and the potentials of both electrodes are reversed symmetrically, these induced potentials may be cancelled. When, for this purpose, the output signals from AC amplifier 3a, 3b are balanced by connecting to balancer 4 and further connected to the input terminals Pa, Pb of differential amplifier 5 via capacitors 4a, 4b, respectively, the input signals to input terminals Pa, Pb are output from the output terminal Q of differential amplifier 5 with the synchronized signal portion being cancelled. Therefore, the induced potentials from commercial power are cancelled as they are synchronized, and the non-equiphaseal and non-synchronized portion of the signals from detection electrodes 2a, 2b induced by the running of yarn 1 is detected as output signal. When this output signal is rectified and smoothed by rectifier 6, there is generated at its output terminal R a DC voltage which is high in potential when the yarn is running and low in potential at the time of yarn break or stoppage of yarn run. Relay circuit 7 is activated according to the level of this DC voltage to issue an output signal as yarn break signal.

The above operations will be more cearly understood from the following explanation given with reference to FIG. 4 which exemplifies the signal wave forms at the respective terminals Pa, Pb, Q and R shown in FIG. 1.

In FIG. 4, the size of each signal is shown on the vertical axis and the time elapsed is graduated on the horizontal axis, N indicating the period of yarn break and S indicating the yarn running period. The signals at the respective terminals Pa, Pb, Q and R are shown synchronized in time with each other vertically in the graph.

During the period of yarn break N, the in-phase and synchronized induction signals Na, Nb from commercial power are added to the input terminals Pa, Pb, so that the unbalanced signal component $NQ = Na - Nb$ is output from the output terminal Q of differential amplifier 5.

During the yarn running period S, the signals $Na+Sa$, $Nb+Sb$, that is, induction signals Na, Nb from commercial power combined with induction signals Sa, Sb from yarn running, are given to the input terminals Pa, Pb, respectively. Therefore, the difference between said two signals, viz. $NQS=(Na+Sa)-(Nb+Sb)=NQ+(Sa-Sb)$, is output from the output terminal Q.

Since the induction signals Na, Nb are in-phase and synchronized with each other, their differential signal $NQ=Na-Nb$ is cancelled to become a small signal. On the other hand, the induction signals Sa, Sb from yarn running are non-in-phase and non-synchronous, their differential signal $SQ=Sa-Sb$ is output as detection signal.

The thus output detection signal SQ is rectified by rectifier 6 and DC signals NR, SR are output to the terminal R. Thus, in case said signal is detected with only one detection electrode 2a, the ratio of the signal Na at the time of yarn stoppage to the signal $Na+Sa$ at the time of yarn running is the signal to noise ratio, or S/N ratio, but in case the signals from two detection electrodes are balanced and differentially amplified as described above, the signal at the time of yarn stoppage $NQ=Na-Nb$ is very small and can be reduced to zero, and in case the detection signal $SQ=Sa-Sb$ is synchronized in an opposite phase, it is possible to obtain the peak signal $SQ=Sa+Sb$ and the S/N ratio is drastically improved.

While the invention has been described with reference to an illustrative embodiment thereof, it will be apparent that the invention admits of various modifications. For instance, the detection electrodes may be designed into other suitable configurations and placed in opposition to each other so that the yarn may pass therebetween, or the detection electrodes and lead wires may be printed integrally to a flexible (film-like) base plate.

Also, the detection electrodes may be connected directly to the differential amplifier, the latter being designed to be capable of balancing the amplification factor, thereby to dispense with the AC amplifier and balancer.

Further, it is possible to incorporate means for balancing the output signals from a plurality of detection electrodes and to make arrangement such that the comparison voltage of the comparator will be of common use for a plurality of unit detectors, making it possible to control the sensitivities of a number of yarn break detectors collectively.

What is claimed is:

1. A yarn break detector for spinning and weaving machines comprising a pair of detection electrodes formed as a printed circuit at the substantially equal areas on a base plate, said detection electrodes being disposed in correspondence to the running yarn and adapted to induce an electric charge on the yarn, a pair of AC amplifiers of high input impedance for amplifying the electric potentials induced by said pair of detection electrodes to which said AC amplifiers are electrically connected via lead wires electrostatically shielded by a shield en bloc, a balancer for balancing the output signals from said pair of AC amplifiers in an in-phase and synchronized fashion, a differential amplifier for differentially amplifying the output signals from said balancer, a rectifier for converting the output signals form said differential amplifier into a DC signal, a comparator which compares the output voltage of said rectifier and regulated comparison voltage and issues an output when the output voltage of said rectifier is lower in potential than the comparison voltage, and a relay circuit which is actuated by the output signal from said comparator, wherein in the event of yarn break or stoppage of yarn run, said relay circuit is activated to issue an output signal as yarn break signal to inform of the yarn break or stoppage of yarn run.

* * * * *